(12) United States Patent
Orsillo

(10) Patent No.: US 7,053,646 B2
(45) Date of Patent: May 30, 2006

(54) APPARATUS AND METHOD FOR USE IN TESTING A SEMICONDUCTOR WAFER

(76) Inventor: James F. Orsillo, 64777 Simone Rd., Bend, OR (US) 97701

( * ) Notice: Subject to any disclaimer, the term of this patent is extended or adjusted under 35 U.S.C. 154(b) by 0 days.

(21) Appl. No.: 10/695,245

(22) Filed: Oct. 27, 2003

(65) Prior Publication Data

US 2004/0227532 A1 Nov. 18, 2004

Related U.S. Application Data

(60) Continuation-in-part of application No. 10/432,808, filed as application No. PCT/US01/28669 on Sep. 14, 2001, application No. 10/695,245, which is a continuation-in-part of application No. 10/439,595, filed on May 16, 2003, application No. 10/695,245, which is a continuation-in-part of application No. 10/107,052, filed on Mar. 28, 2002, which is a division of application No. 09/662,735, filed on Sep. 15, 2000, now Pat. No. 6,408,500.

(60) Provisional application No. 60/454,102, filed on Mar. 11, 2003, provisional application No. 60/397,167, filed on Jul. 18, 2002.

(51) Int. Cl.
*G01R 31/26* (2006.01)

(52) U.S. Cl. .................................... 324/765
(58) Field of Classification Search ........ 324/754–755, 324/758, 761, 765, 158.1; 439/482; 29/832; 414/591–592; 209/573–574
See application file for complete search history.

(56) References Cited

U.S. PATENT DOCUMENTS

| | | | |
|---|---|---|---|
| 5,068,601 A | * | 11/1991 | Parmenter ................. 324/754 |
| 5,220,279 A | | 6/1993 | Nagasawa |
| 5,264,787 A | | 11/1993 | Woith et al. |
| 5,355,079 A | | 10/1994 | Evans et al. |
| 5,410,259 A | | 4/1995 | Fujihara et al. |
| 5,489,853 A | * | 2/1996 | Nakajima ................. 324/754 |
| 5,528,158 A | | 6/1996 | Sinsheimer et al. |
| 5,575,073 A | | 11/1996 | von Wedemayer |
| 5,642,056 A | * | 6/1997 | Nakajima et al. .......... 324/758 |
| 5,644,246 A | * | 7/1997 | Lee et al. ................. 324/754 |
| 5,647,178 A | | 7/1997 | Cline |
| 5,656,942 A | | 8/1997 | Watts et al. |
| 5,778,485 A | | 7/1998 | Sano et al. |
| 5,804,983 A | | 9/1998 | Nakajima et al. |
| 5,814,158 A | | 9/1998 | Holländer et al. |
| 5,828,225 A | * | 10/1998 | Obikane et al. ........... 324/758 |
| 5,861,759 A | | 1/1999 | Bialobrodski et al. |
| 5,913,555 A | | 6/1999 | Richter et al. |
| 5,923,180 A | * | 7/1999 | Botka et al. .............. 324/758 |
| 5,949,244 A | | 9/1999 | Miley |
| 5,961,728 A | | 10/1999 | Kiser et al. |

(Continued)

FOREIGN PATENT DOCUMENTS

EP 0699 913 A2 3/1996

(Continued)

*Primary Examiner*—Jermele Hollington
(74) *Attorney, Agent, or Firm*—Klarquist Sparkman, LLP

(57) ABSTRACT

The present disclosure relates to an apparatus for use with a probe station in the testing of semiconductor wafers. In one embodiment, an apparatus for testing semiconductor devices includes a first plate and a second plate. The first plate is configured to be mounted to and completely removable from the head stage of a probe station. The second plate is configured to be removably coupled to the first plate and has a major aperture for receiving a probe-card assembly. Docking equipment desirably is mounted to a major surface of the second plate to facilitate docking of a tester to the probe station.

42 Claims, 6 Drawing Sheets

U.S. PATENT DOCUMENTS

| | | |
|---|---|---|
| 5,968,282 A | 10/1999 | Yamasaka |
| 5,974,662 A | 11/1999 | Eldridge et al. |
| 6,056,627 A | 5/2000 | Mizuta |
| 6,060,892 A | 5/2000 | Yamagata |
| 6,078,186 A * | 6/2000 | Hembree et al. ........... 324/755 |
| 6,114,869 A | 9/2000 | Williams et al. |
| 6,118,290 A | 9/2000 | Sugiyama et al. |
| 6,121,058 A | 9/2000 | Shell et al. |
| 6,166,553 A | 12/2000 | Sinsheimer |
| 6,271,658 B1 | 8/2001 | Vallinan et al. |
| 6,304,092 B1 | 10/2001 | Jordan |
| 6,306,187 B1 | 10/2001 | Maeda et al. |
| 6,408,500 B1 * | 6/2002 | Orsillo ...................... 324/758 |
| 6,424,141 B1 * | 7/2002 | Hollman et al. ............ 324/754 |
| 6,433,562 B1 | 8/2002 | McAllister et al. |
| 6,476,626 B1 | 11/2002 | Aldaz et al. |
| 6,483,798 B1 | 11/2002 | Wu |
| 6,741,072 B1 * | 5/2004 | Orsillo .................... 324/158.1 |
| 6,813,817 B1 * | 11/2004 | Orsillo ...................... 324/758 |
| 6,839,948 B1 * | 1/2005 | Orsillo ...................... 324/758 |
| 6,853,205 B1 * | 2/2005 | Cheng et al. ............... 324/754 |

FOREIGN PATENT DOCUMENTS

| | | |
|---|---|---|
| JP | 05144892 | 6/1993 |
| WO | WO 96/30772 | 10/1996 |

* cited by examiner

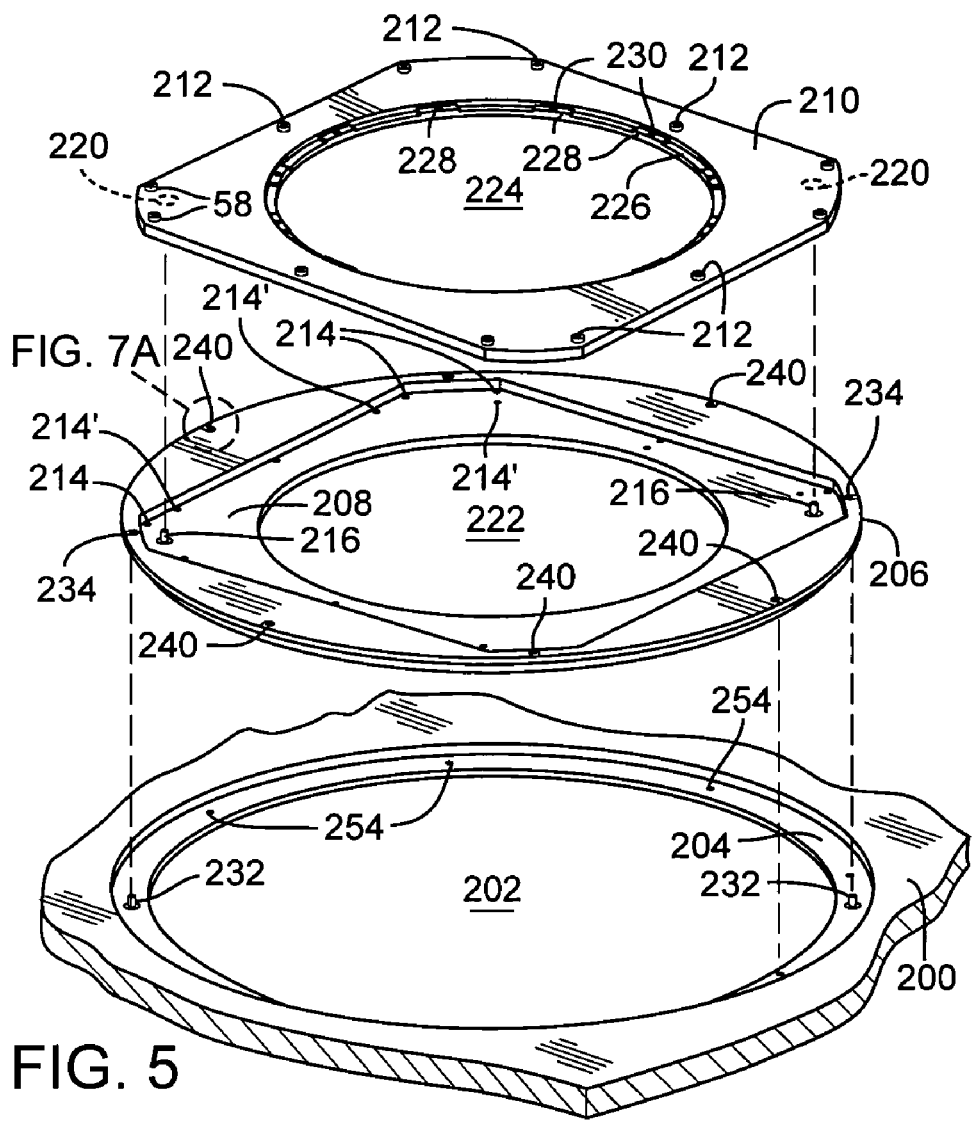
FIG. 5
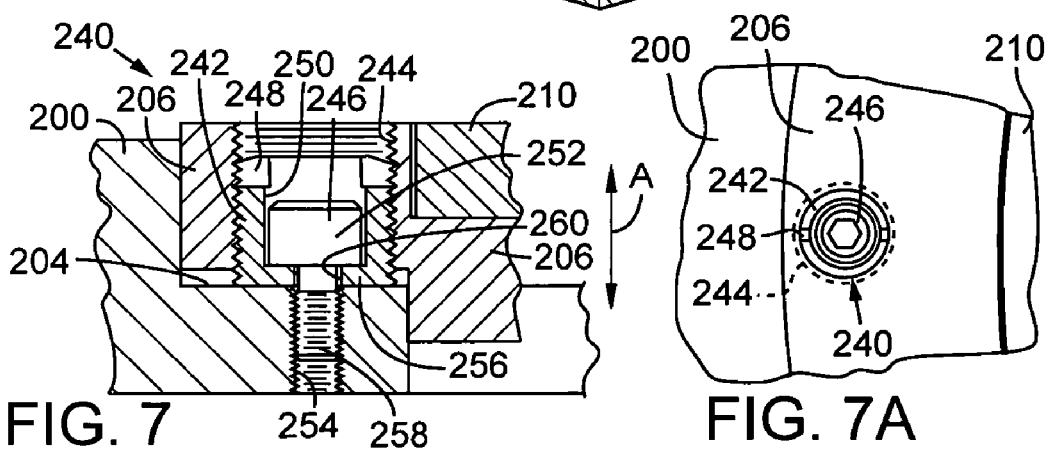
FIG. 7
FIG. 7A

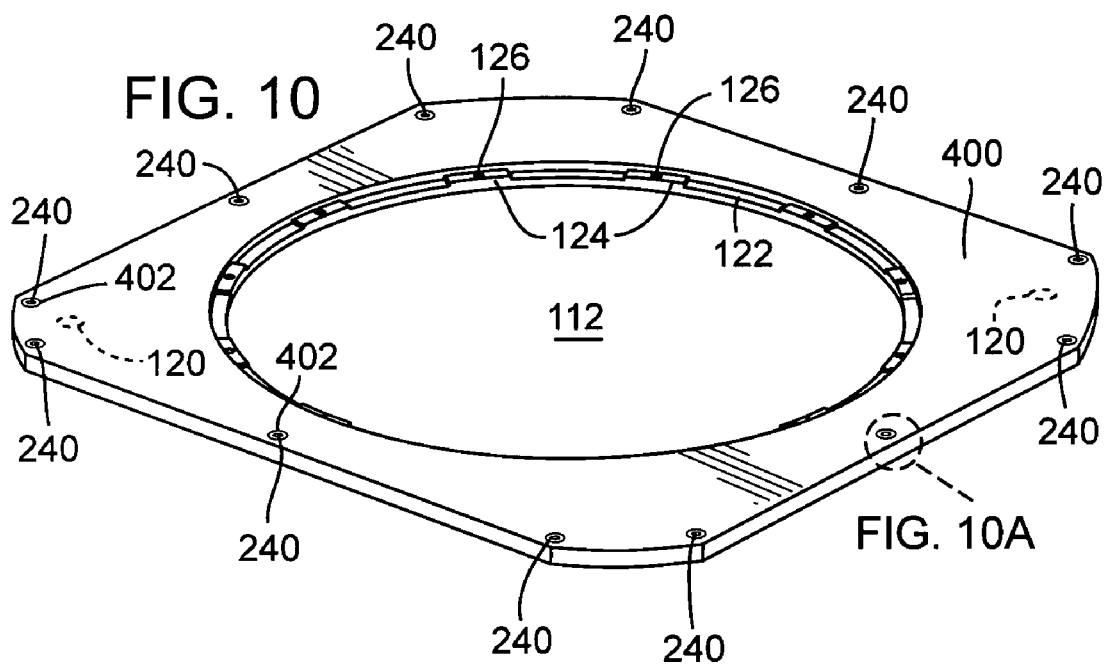
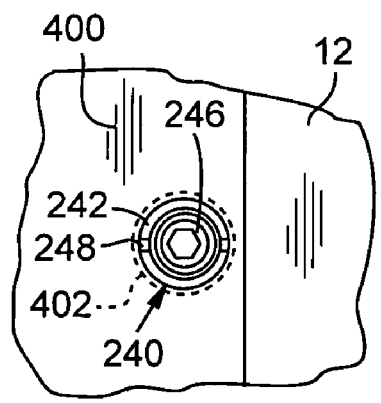

APPARATUS AND METHOD FOR USE IN TESTING A SEMICONDUCTOR WAFER

CROSS-REFERENCE TO RELATED APPLICATIONS

The present application claims the benefit of U.S. Provisional Application No. 60/454,102, filed Mar. 11, 2003. In addition, the present application is a continuation-in-part of U.S. application Ser. No. 10/107,082, filed Mar. 25, 2002, now U.S. Pat. No. 6,925,699, which is a divisional of U.S. application Ser. No. 09/662,735, filed Sep. 15, 2000, now U.S. Pat. No. 6,408,500. This application also is a continuation-in-part of U.S. application Ser. No. 10/432,808, filed May 23, 2003, which is the National Stage of International Application No. PCT/US01/28669, filed Sep. 14, 2001, and which claims the benefit of U.S. application Ser. No. 09/662,735, now U.S. Pat. No. 6,408,500. This application also is a continuation-in-part of U.S. application Ser. No. 10/439,595, filed May 16, 2003, which claims the benefit of U.S. Provisional Application No. 60/397,167, filed Jul. 18, 2002. Application Ser. Nos. 10/107,052, 09/662,735, 60/454,102, 10/432,808, PCT/US01/28669, 10/439,595, and 60/397,167 are incorporated herein by reference.

FIELD

Described herein are apparatus and methods relating to testing semiconductor wafers, and more specifically, to embodiments of an apparatus for use with a probe station in the testing of semiconductor wafers, and methods for its use.

BACKGROUND

In the manufacture of semiconductor devices, multiple semiconductor devices (known as chips) are formed on a semiconductor wafer, and then divided into portions to separate the semiconductor devices from each other. Typically, before dividing the wafer, the electrical characteristics of each semiconductor device are tested.

A device known as a probe station (also known as a prober or probing apparatus) is used to test the semiconductor devices. Most probe stations have a movable support table known as a "wafer chuck" for supporting the semiconductor wafer under test. The probe station also has a head plate (also known as a head stage) that defines an original head plate aperture. The aperture supports a circular device known as a probe-card dish (also known as a probe-card ring or ring carrier), which in turn supports a probe card. The probe card has multiple probes usually in the form of elongated needles, which are configured to register with respective electrode pads of the semiconductor wafer supported on the wafer chuck. To test the semiconductor devices of the wafer, the wafer chuck brings the electrode pads of the wafer into contact with the probes. A separate piece of equipment, known as a tester, is lowered into mating position with respect to the probe station, and establishes an electrical circuit with the probe card and the wafer to enable testing of the wafer.

Generally, a number of guides and associated docking equipment pieces are needed to successfully dock a tester to a probe station. Probe stations are usually sold to semiconductor manufacturing facilities with this docking equipment already installed. Unfortunately, the docking equipment, which is typically installed by the probe station vendor or a secondary source, generally permits docking to a single make of tester. The installation of docking equipment to permit the use of a different tester with the probe station is referred to in the industry as "hardware swap-out" and results in extensive use of technician time and equipment down time.

Another issue facing semiconductor manufacturers is the lack of uniformity of head plate apertures among the various commercial lines of probe stations. The unfortunate result is that there is currently no known technique for mating a probe station having a first head-plate aperture size with a tester designed to mate with a probe station having a second head-plate aperture size.

Another issue facing semiconductor manufacturers is the ability of conventional probe cards to successfully establish electrical contact with each electrode pad of a wafer. In particular, as semiconductor devices become smaller and smaller due to advances in technology, probe cards with a greater density of probes are required. If the electrode pads of a large number of semiconductor devices are to be simultaneously brought into contact with corresponding probes, it is difficult to dispose the wafer such that the wafer is accurately parallel with the contact points of the probes. As a result, it is difficult to bring all of the electrode pads into contact with their respective probes, and to apply uniform pressure to the contact points of the probes.

Accordingly, there exists a need for improved systems for testing semiconductor devices.

SUMMARY

The present invention concerns embodiments of an apparatus that facilitates the testing of semiconductor devices using a probe station and that increases the flexibility of a probe station.

According to one representative embodiment, an assembly for testing semiconductor devices with a probe station includes a first plate and a second plate. The first plate is configured to be mounted to and completely removable from the head stage of the probe station. The second plate is configured to be removably coupled to the first plate and has a major aperture for receiving a probe-card assembly. Docking equipment desirably is mounted to a major surface of the second plate to facilitate docking of a tester to the probe station. The docking equipment can include one or more individual docking units that mate with corresponding docking units on the tester.

In particular embodiments, the assembly can include at least one adjustment mechanism configured to adjust the tilt orientation of the probe-card assembly relative to the head stage. By selectively adjusting the tilt orientation of the probe-card assembly, the probes of the probe-card assembly can be planarized with respect to a semiconductor wafer in the probe station to ensure a satisfactory electrical connection between the probes and corresponding electrical contacts on the semiconductor wafer.

In an illustrated embodiment, the adjustment mechanism includes an adjusting screw that extends through the first plate and bears against an adjacent surface of the head stage. Rotation of the adjusting screw changes the tilt orientation of the first plate, the second plate, and the probe-card assembly relative to the head stage. The adjustment mechanism may further include a retaining screw that extends generally co-axially through the adjustment screw and is tightened into the head stage to retain the first plate on the head stage.

In certain embodiments, the first plate is formed with a major aperture and a recessed portion substantially surrounding the major aperture. The second plate is configured to fit within the recessed portion of the first plate. When the second plate is positioned in the recessed portion, the major aperture of the second plate at least partially overlaps the major aperture of the first plate and a major aperture of the head stage, thereby allowing the probes of the probe-card assembly to contact the semiconductor wafer in the probe station.

In some embodiments, the major aperture of the second plate is dimensioned to receive a first probe-card assembly having a first diameter and the assembly further includes a third plate having a major aperture for receiving a second probe-card assembly having a second diameter that is larger than the first diameter. The third plate is also mountable to and completely removable from the head stage of the probe station. Thus, in this embodiment, either the third plate or the first and second plates can be alternately mounted to the head stage for using two differently sized probe-card assemblies. When the first and second plates are mounted to the head stage, the first probe-card assembly can be used to permit testing of a first semiconductor wafer. Alternatively, when the third plate is mounted to the head stage, the second probe-card assembly can be used to permit testing of a second semiconductor wafer that is larger than the first semiconductor wafer.

According to another representative embodiment, a method for testing semiconductor wafers using a probe station comprises mounting an adapter member to an upper surface of the head stage. A first docking-equipment-mounting member is coupled to the adapter member, a first probe-card assembly is positioned in an aperture defined in the first docking-equipment-mounting member, and first docking equipment are mounted to an upper surface of the docking-equipment-mounting member. Thereafter, a first tester can be docked to the first docking equipment and a first semiconductor wafer in the probe station can be tested.

In one embodiment, the same probe station can be used to dock a second tester to the probe station. In this regard, the first docking-equipment-mounting member can be removed from the adapter member and a second docking-equipment-mounting member can be coupled to the adapter member. A second probe-card assembly (which can be the same as or different than the first probe-card assembly) is positioned in an aperture defined in the second docking-equipment-mounting member and second docking equipment are mounted to an upper surface of the second docking-equipment-mounting member to permit docking of a second tester to the probe station.

In another embodiment, the same probe station can also be adapted to receive a differently sized probe-card assembly. In this regard, the adapter member and the first docking-equipment-mounting member can be removed from the head stage, and a second docking-equipment-mounting member can be mounted to the upper surface of the head stage. A second probe-card assembly, which has a diameter that is different than the diameter of the first probe-card assembly, is positioned in an aperture defined in the second docking-equipment-mounting member. Second docking equipment (which can be the same as or different than the first docking equipment) can be mounted to an upper surface of the second docking-equipment-mounting member.

According to another representative embodiment, a method for testing semiconductor wafers using a probe station comprises coupling a probe-card-support device to an upper surface of the head stage, supporting a probe-card assembly with the probe-card-support device, and positioning a semiconductor wafer in the probe station. The tilt orientation of the probe-card-support device relative to the wafer is then adjusted to optimize contact between the probes of the probe-card assembly and the corresponding contacts on the wafer.

According to still another representative embodiment, an apparatus for testing semiconductor wafers with a probe station includes a probe-card-support device for supporting a probe-card assembly. The probe-card-support device is configured to be mounted to and completely removable from the head stage. The probe-card-support device also is adjustable so as to adjust the tilt orientation of the probe-card assembly with respect to a semiconductor wafer positioned in the probe station.

According to yet another representative embodiment, a system for testing semiconductor devices includes a probe station and a tester for docking with the probe station during testing of a semiconductor wafer. The system also includes an adapter member configured to be mounted to and completely removable from the head stage of the probe station and a probe-card-support member configured to be mounted to and completely removable from the adapter member. The probe-card-support member has first and second opposed major surfaces and a major aperture for receiving a probe-card assembly. Docking equipment, which is adapted to facilitate docking of the tester to the probe station, can be mounted to one of the first and second major surfaces of the probe-card-support member.

The foregoing and other features and advantages of the invention will become more apparent from the following detailed description of several embodiments, which proceeds with reference to the accompanying figures.

BRIEF DESCRIPTION OF THE DRAWINGS

FIG. 5 is an exploded, perspective view of a portion of a head stage of another probe station, showing a probe-card-support plate and an adapter plate for mounting the probe-card-support plate to the head stage, according to one embodiment.

FIG. 7 is an enlarged cross-sectional view taken along line 7—7 of FIG. 6A, showing an adjustment mechanism for adjusting the tilt orientation of the adapter plate.

FIG. 7A is an enlarged plan view of an adjustment mechanism of a portion of the probe-card-support plate, the adapter plate, and the headstage of FIG. 5.

FIG. 10 is a perspective view of another embodiment of a probe-card-support plate.

FIG. 10A is an enlarged top plan view of a portion of the probe-card-support plate of FIG. 10, showing one of a plurality of adjustment mechanisms for adjusting the tilt orientation of the plate.

DETAILED DESCRIPTION

As used herein, the singular forms "a," "an," and "the" refer to one or more than one, unless the context clearly dictates otherwise.

As used herein, the term "includes" means "comprises."

As used herein, a group of individual members stated in the alternative includes embodiments relating to a single member of the group or combinations of multiple members. For example, the term "a, b, or c," includes embodiments relating to "a," "b," "c," "a and b," "a and c," "b and c," and "a, b, and c."

Figure 1:
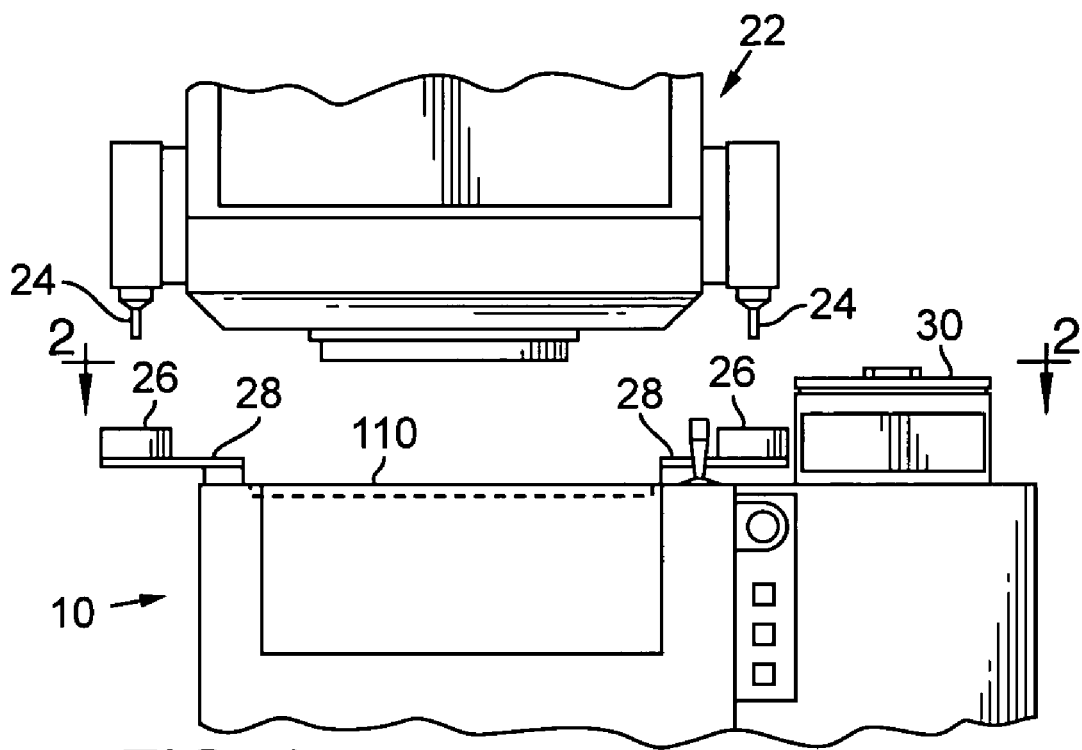
FIG. 1 is a side elevation view of a probe station and a tester situated generally above the probe station, showing a probe-card-support plate, according to one embodiment, installed on the head stage of the probe station.
Figure 2:
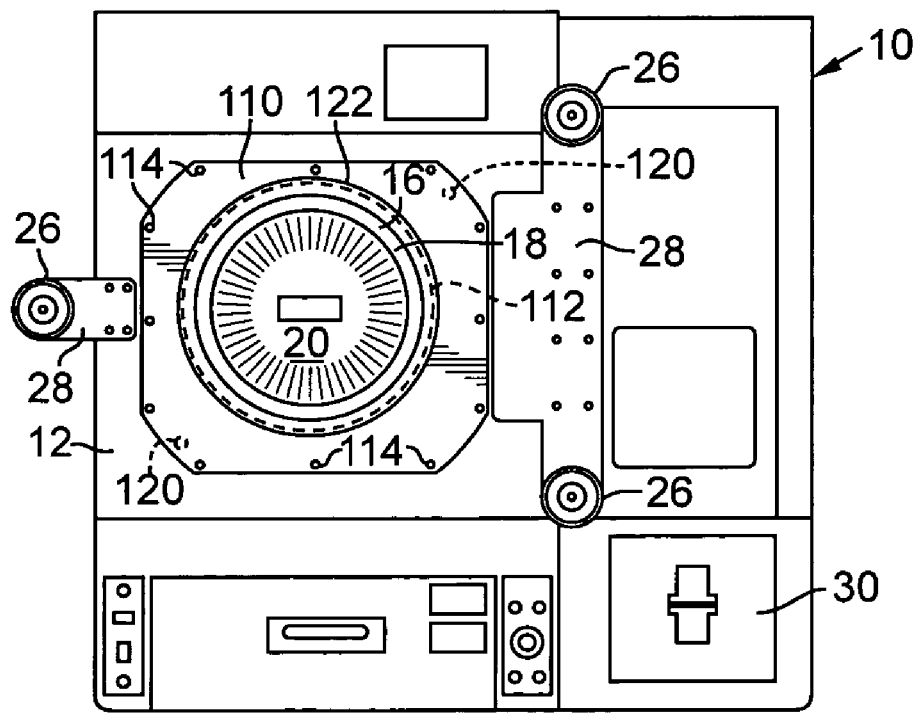
FIG. 2 is a top plan view of the probe station of FIG. 1.
Figure 3:
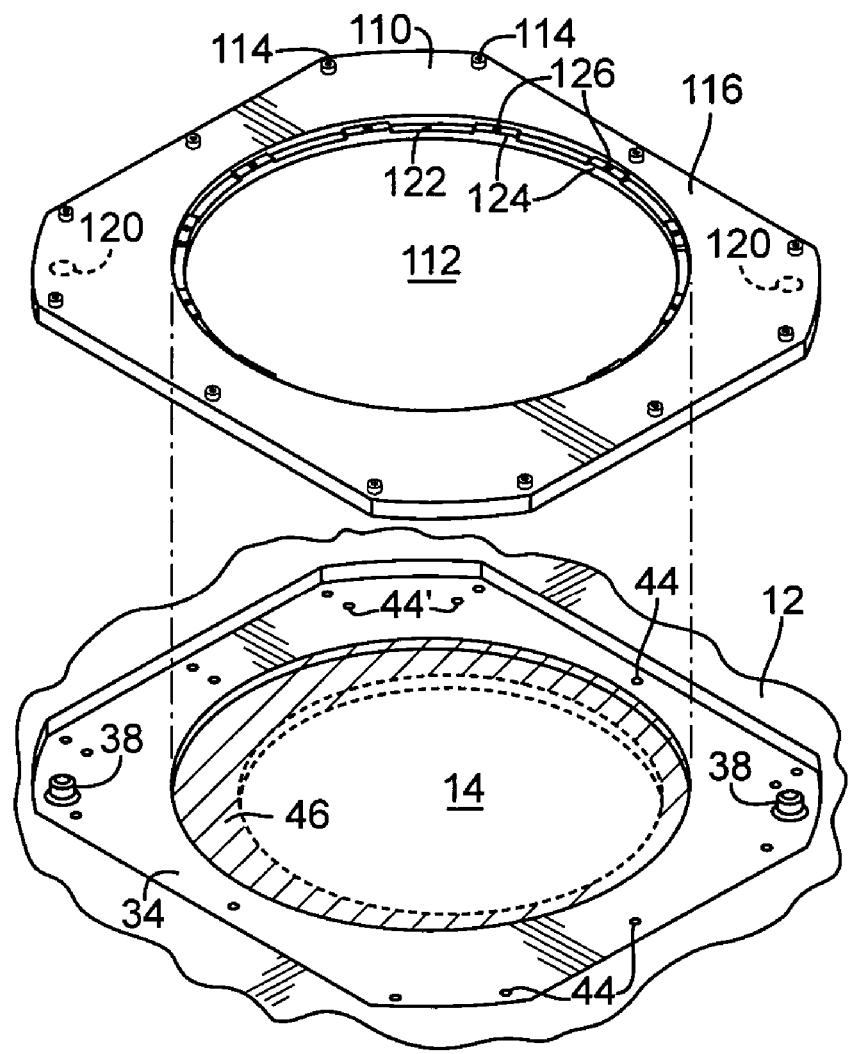
FIG. 3 is an exploded, perspective view of a portion of the probe station and the probe-card-support plate of FIG. 1.

Referring first to FIGS. 1 and 3, there is shown a system for testing semiconductor devices. The system generally includes a probe station 10 having a head stage 12 (FIG. 2) that defines an original head-plate aperture 14 (FIG. 3). As shown in FIG. 1, a tester 22 having docking units 24 is situated generally above the probe station 10. The tester 22 is movable generally upwardly and downwardly with respect to the head state 12. In the embodiments of FIGS. 1 and 2, docking equipment is mounted to the head stage 12 to facilitate docking of the tester 22 with the probe station 10.

As shown in FIGS. 1 and 2, the docking equipment in the illustrated embodiment comprises one or more docking units 26 that mate with one or more corresponding docking units 24 mounted on the tester 22. The illustrated docking units 26 are supported on respective docking-equipment plates, or support members, 28 mounted on the head stage 12.

To perform semiconductor wafer testing, the tester 22 is docked to the probe station 10 by lowering the tester 22 toward the head stage 12 until the docking units 24 mate with corresponding docking units 26 on the probe station 10. When the tester 22 is lowered into mating position with the probe station 10, electrodes on the tester 22 come into electrical contact with a probe card 20 (FIG. 2). The underside of the probe card 20 includes multiple probes, which contact respective electrode pads, or contacts, on a semiconductor wafer (not shown) supported in the probe station 10, thus establishing electrical connectivity between the semiconductor wafer, the probe card 20 and the tester 22.

As shown in FIGS. 1–3, the head stage 12 supports a probe-card-support device in the form of a probe-card-support plate 110 (also referred to herein as a tooling plate and a probe-card support member in other embodiments). The probe-card-support plate 110 supports a probe-card assembly 16 (FIG. 2) during testing of a semiconductor device. As best shown in FIG. 3, the illustrated probe-card-support plate 110 desirably (although not necessarily) has a generally flat upper surface 116 and a generally flat, opposed lower surface (not shown), and is formed with a major aperture 112 dimensioned to receive the probe-card assembly 16.

The probe-card-support plate 110 in the illustrated embodiment is generally square, although the shape of plate 110 is not limited to that shown in the illustrated embodiment. Accordingly, the plate 110 may comprise any other geometric shape, such as a rectangle, oval, triangle or any combination or variation thereof.

As shown in FIG. 2, the illustrated probe-card assembly 16 includes a ring carrier 18 (also known as a probe-card holder or probe-card ring) that carries the probe card 20. The ring carrier 18 is a rigid annular ring that is secured to the outer periphery of the probe card 20 to increase the rigidity of the probe card. In other embodiments, the probe-card assembly 16 includes the probe card, but not the ring carrier, in which case the probe card would be directly supported by plate 110. In the illustrated configuration, as best shown in FIG. 3, a lip portion, or rim 122, is defined around the circumference of aperture 112 to support the probe-card assembly 16. The lip portion 122 may be formed with a plurality of circumferentially spaced bosses 124. Each boss 124 may be formed with a threaded hole 126 for receiving a fastener for retaining the probe-card assembly 16 on the lip portion 122.

In one implementation, the probe-card-support plate 110 is disposed in a recess, or area of reduced thickness, 34 formed in the head stage 12 (as best shown in FIG. 3). One approach for retrofitting an existing probe station or manufacturing a new probe station to receive the plate 110 is as follows. Material is machined away from the top of the head stage 12 of the probe station 10 to form the recess 34. In one implementation, for example, 0.3 mm (12 mils) of material is machined away from the top of the head stage 12. When retrofitting an existing probe station, it may be necessary to remove the head stage 12 from the probe station to machine recess 34. One or more through-holes (not shown) may be drilled into the recess 34 to facilitate the attachment of one or more dowel pins 38 (also referred to herein as alignment members or alignment pins). The plate 110 can be formed with one or more corresponding locator holes 120, which are dimensioned to mate with respective pins 38 to facilitate the positioning of the plate 110 on the head stage 12. The dowel pins 38 desirably are positioned with great precision relative to the center of the head-plate aperture 14 to ensure correct alignment and positioning of the plate 110. Additionally, one or more threaded holes 44 may be machined just inside the outer edge of the recess 34, and one or more corresponding holes 114 may be formed in the plate 110. To retain the plate 110 on the head stage 12, one or more screws (not shown) are set into holes 114 and tightened into holes 44 of the head stage 12. In particular embodiments, spring loaded screws are inserted into holes 114 and tightened into holes 44 to retain plate 110 on the head stage 12. Such spring-loaded screws are advantageous in that they permit rapid attachment of the plate 110 to the head stage 12. In yet further embodiments, clamps or other types of fasteners can be used, instead of screws, to retain plate 110 on the head stage 12.

Figure 4:
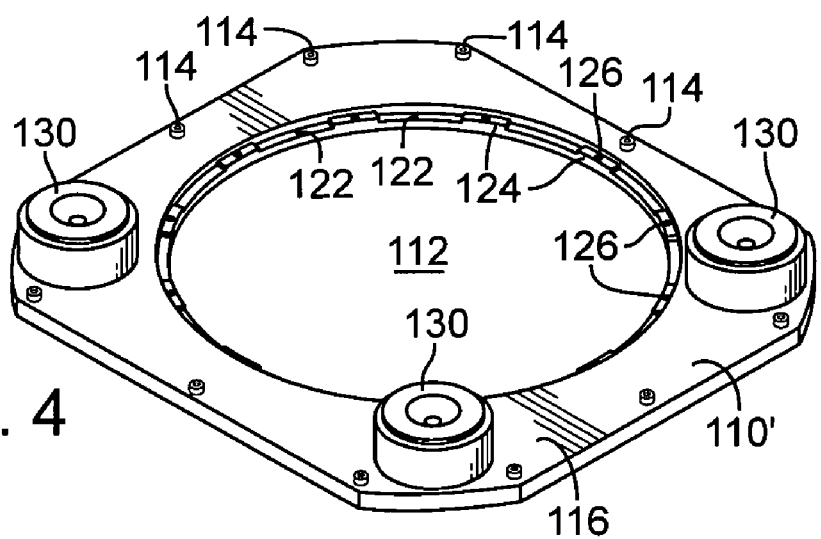
FIG. 4 is a perspective view of a probe-card-support plate, according to another embodiment, having docking equipment mounted to the upper surface thereof.

In the embodiment of FIGS. 1–3, the docking equipment is mounted to the upper surface of head stage 12. In another embodiment, as shown in FIG. 4, docking equipment comprising one or more docking units 130 is mounted to a plate 110', rather than on the head stage 12. In this manner, plate 110' serves as a docking-equipment-mounting member. The docking units 130 are mounted such that each docking unit 130 aligns with a corresponding docking unit 24 on tester 18 (FIG. 1). In particular embodiments, docking units 130 are kinematic docking units, as known in the art, although other types of docking units also can be used. In yet another embodiment, the docking units 130 can be mounted on one or more docking-equipment plates (such as docking equipment plates 28 of FIG. 2), which in turn are mounted to the upper surface of plate 110'.

The configuration of the docking equipment shown in FIGS. 1 and 2 is known as an A-type docking configuration. Various other docking configurations, such as a B-type docking configuration can also be employed. The specific docking configuration required for a particular application will usually depend upon the docking configuration of the tester that is selected for the application.

Ideally, a number of tooling plates 110' could be provided, each one having a different docking configuration adapted to dock with a particular tester. In this manner, a semiconductor manufacturing facility that owns a number of testers could dock any of the testers with any probe station by simply installing the plate having docking equipment configured to dock with the selected tester. For example, a tester having an A-type docking configuration can be used with a probe station by simply selecting and installing on the probe station a plate having docking equipment arranged in an A-type docking configuration. Moreover, if more than one probe station is configured to accept any one out of a number of plates 110', than any one of these testers could be placed in service with any probe station for which a matable plate 110' is available.

It should be expressly noted that by producing a set of plates, each of which has a standardized set of location and attachment items, and by modifying a set of probe stations so that each one has a standardized set of location and attachment items (e.g., alignment pins 38 and holes 44) designed to mate to the plate location and attachment items (e.g., locator holes 120 and holes 114 for receiving screws), that a great flexibility can be achieved in the sense that any of the probe stations can be mated to any of the plates and thereby to any tester for which such a plate is available. This technique appears to be unknown in the prior art and can be applied even to probe stations of differing makes, such as the popular brands TSK®, TEL® and EG®.

In an alternative implementation of plate 110, the plate 110 is mounted to the upper surface of the head stage 12, but a recess 34 is not machined in the head stage 12 to receive the plate 110. In this alternative embodiment, dowel pins 38 and threaded holes 44 can be provided on the top surface of head plate 12.

In another embodiment, a second set of threaded holes 44' (FIG. 3) can be formed in recess 34 for the attachment of a smaller plate 110 (not shown). Such a smaller plate 110 would typically be made to fit a probe station 10 having a smaller head stage 12. By providing the second set of threaded holes 44', a probe station 10 is thus configured to receive such a smaller plate 110 made primarily for a different line of probe stations 10 having smaller head stages 12.

Referring again to FIGS. 1–2, in some instances, a probe station will have a head stage 12 that is fairly small and will, further, have an obstacle 30, such as the cover for the device that loads probe-card assemblies into position on the head stage 12 (known as the "loader cover"). When selecting a tester having a docking configuration that is not conventionally used with the probe station 10, it may not be possible to dock this type of tester to the probe station without moving the location of the probe-card assembly 16 away from the obstacle. To achieve such ends, the original head-stage aperture 14 is enlarged by region 46 (FIG. 3), and a probe-card-support plate is provided with a major aperture that is offset from the geometric center of the plate. When such a plate is installed, the center of the major aperture of the probe-card-support plate is offset from the center of the original head-stage aperture 14 and is further away from obstacle 30, thereby permitting the selected tester to dock with the probe station 10 without encountering the obstacle.

The size of a probe card 20 can vary depending on the size of the semiconductor wafer to be tested. Two commonly used sizes of probe cards include a probe card for testing 200-mm semiconductor wafers (referred to herein as a "200-mm probe card") and a probe card for testing 300-mm semiconductor wafers (referred to herein as a "300-mm probe card"). Because the 300-mm probe card has a larger diameter than the 200-mm probe card, the head stage 12 of a probe station requires a larger head stage-aperture 14 when testing a 300-mm wafer than is required when testing a 200-mm wafer. Consequently, in a conventional probe station, a head-stage aperture sized for a 300-mm probe card is too large to support a 200-mm probe card, and a head-stage aperture sized for a 200-mm probe card is too small to accommodate a 300-mm probe card. Thus, conventional probe stations are usually limited to testing one size of a semiconductor wafer. To further increase the flexibility of a probe station, it would be desirable to be able to use one probe station to test semiconductor wafers of more than one size, such as for testing both 300-mm and 200-mm wafers.

To such ends, FIGS. 5–9 show one embodiment of a system that allows a probe station to accommodate at least a first probe-card assembly (not shown) having a first diameter and a second, larger probe-card assembly (not shown) having a second diameter greater than the first diameter so as to allow the probe station to be used to test at least two differently sized wafers. In particular embodiments, for example, the first probe-card assembly includes a 200-mm probe card for testing a 200-mm wafer and the second probe-card assembly includes a 300-mm probe card for testing a 300-mm wafers. In other embodiments, however, the first and second probe-card assemblies can have probe cards adapted to test wafers of other sizes, such as a 50-mm wafer or a 100-mm wafer.

Referring to FIG. 5, there is shown a head stage 200 of a probe station having a head-stage aperture 202. The head-stage aperture 202 is dimensioned large enough to accommodate the second probe-card assembly to be used when testing larger semiconductor wafers. If retrofitting an existing probe station that has a head-stage aperture originally sized for accommodating the first probe-card assembly, the head-stage aperture is increased to form an aperture large enough to receive the second probe-card assembly.

Supported on the head stage 200 is a probe-card-support device comprising an adapter plate 206 (also referred to herein as an adapter member) and a probe-card-support plate 210 carried by adapter plate 206. A lip portion, or rim, 204 desirably is formed around the circumference of the aperture 202 to support the adapter plate 206 within aperture 202. The illustrated adapter plate 206 is an annular ring, although in other embodiments the adapter plate can have other geometric shapes, such as a square, rectangle, ellipse, or any of various other shapes.

The adapter plate 206, as shown in FIG. 5, is formed with a recessed portion, or area of reduced thickness, 208, surrounding a major aperture 222. Recessed portion 208 is dimensioned to receive the probe-card-support plate 210. Desirably, the depth of recessed portion 208 is such that when the plate 210 is positioned in the recessed portion, the upper surface of plate 210 is generally co-planer to the upper surface of adapter plate 206. Plate 210 desirably is removably mounted to the adapter plate 206, such as with suitable fasteners set in apertures 212 and tightened into corresponding threaded holes 214 in the adapter plate 206. In one particular embodiment, for example, the fasteners are spring-loaded screws (not shown) permitting rapid attachment of the plate 210 to the adapter plate 206. In other embodiments, clamps or types of fasteners can be used, instead of screws, to retain plate 210 on the adapter plate 206. An additional set of holes 214' can be formed in recess portion 208, in the same manner as holes 44' of FIG. 3, for retaining a smaller probe-card-support plate in recessed portion 208.

One or more holes (not shown) can be formed (e.g., by drilling) in the recessed portion 208 of the adapter plate 206 to secure one or more alignment members 216 (e.g., pins). Corresponding holes 220 can be formed in the plate 210 to receive respective alignment members 216. Alignment members 216 desirably are positioned with great precision relative to the center of the major aperture 222 of the adapter plate 206 to ensure correct alignment and positioning of the probe-card-support plate 210.

Although not required, to facilitate positioning and alignment of the adapter plate 206 on the head stage 200, the rim portion 204 of the head stage 200 can be provided with one or more alignment pins 232 (FIG. 5) for insertion into one or more corresponding holes 234 formed in the adapter plate 206. Alignment pins 232 desirably are configured to fit loosely within their respective holes 234 to permit adjustment of the tilt orientation of the adapter plate 206 and the probe-card-support plate 210, as described below.

Figures 6A, 6B, 6C:
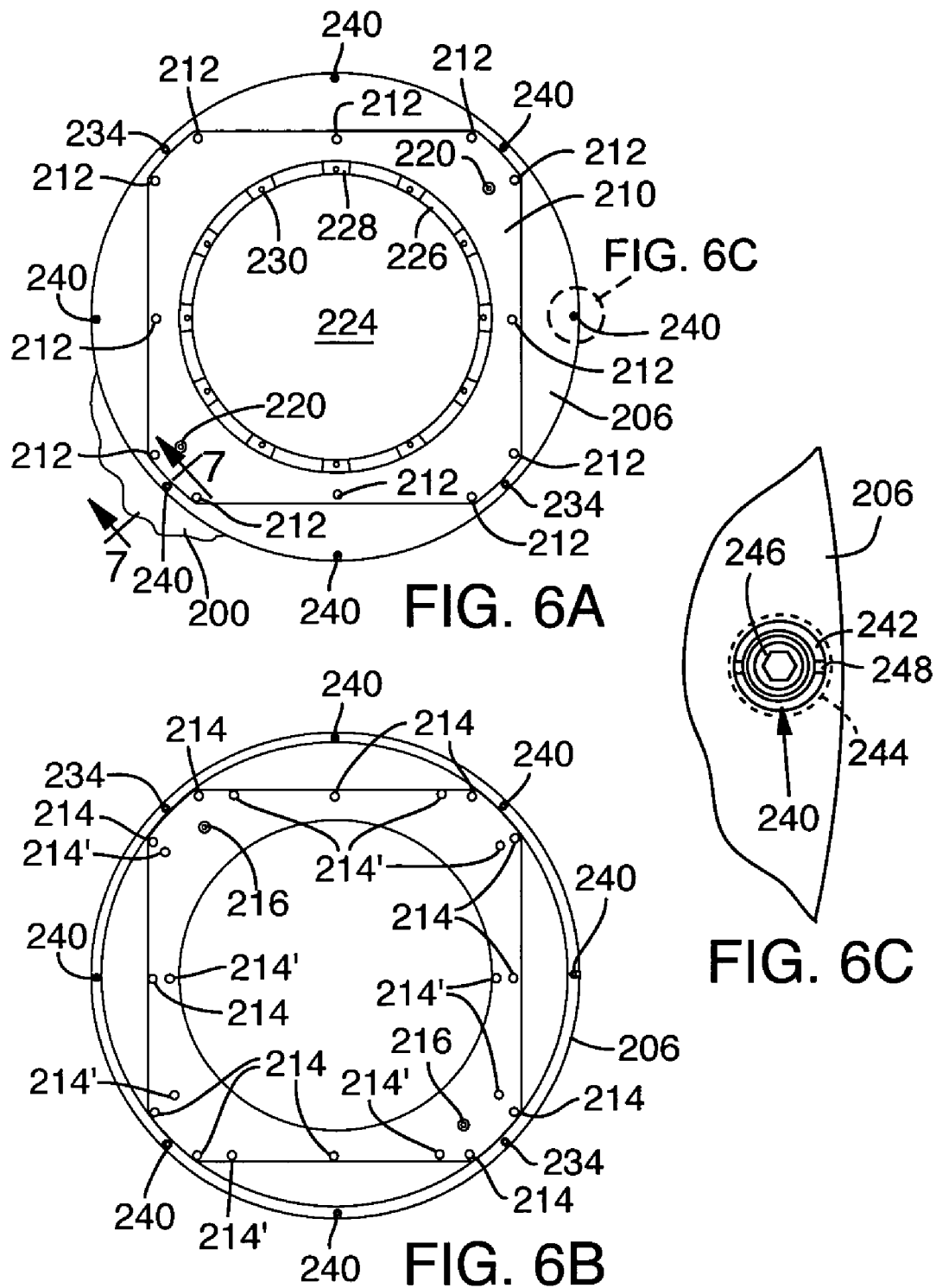
FIG. 6A is a top plan view of the probe-card-support plate and the adapter plate of FIG. 5, shown with the probe-card-support plate nested within the adapter plate.
FIG. 6B is a top plan view of the adapter plate shown without the probe-card-support plate.
FIG. 6C is an enlarged plan view of a portion of the adapter plate of FIG. 6B, showing one of a plurality of adjustment mechanisms for adjusting the tilt orientation of the adapter plate.

The probe-card-support plate 210 defines a major aperture 224 dimensioned to receive the first probe-card assembly (not shown). The probe-card-support plate 210 can have a configuration similar to the probe-card-support plate 110 of FIGS. 1–3. For example, in the illustrated embodiment, a lip portion 226, functioning to support the first probe-card assembly, is defined around the circumference of the major aperture 224 (FIGS. 5 and 6A). The lip portion 226 can be formed with a plurality of circumferentially spaced bosses 228, each having a threaded hole 230 for receiving a fastener for retaining the first probe-card assembly on the probe-card-support plate 206 (FIGS. 5 and 6A).

To facilitate positioning of the probe-card assembly relative to the semiconductor wafer supported on a wafer chuck in the probe station, the adapter plate 206 can have one or more adjustment mechanisms 240 (FIGS. 5, 6A, 6B, 6C, and 7). Adjustment mechanisms 240 are operable to adjust the tilt orientation of the adapter plate 206, and therefore the tilt orientation of the probe-card-support plate 210 and the probe-card assembly supported therein, relative to the semiconductor wafer supported in the probe station. By selectively adjusting the tilt orientation of the probe-card assembly, the probes of the probe-card assembly can be "planarized" relative to the wafer chuck and the corresponding contacts on the semiconductor wafer under test. As used herein, the term "planarize" means to adjust the tilt orientation of a probe card so that the probe tips of the probe card define a plane that is parallel to the support surface of the wafer chuck and the wafer surface within specified tolerances to ensure a satisfactory electrical connection between the probes and the contacts on the wafer.

The adapter plate 206 desirably includes at least three adjustment mechanisms 240 to allow the adapter plate 206, the probe-card-support plate 210 and the probe-card assembly to be tilted in any direction depending upon how the adjustment mechanisms are selectively adjusted. As shown in FIGS. 5, 6A and 6B, the illustrated adapter plate 206 has a plurality of adjustment mechanisms 240 circumferentially spaced along the outer periphery of the adapter plate 206.

As best shown in FIG. 7, each adjusting mechanism 240 includes an adjusting screw 242 (also referred to herein as a lifting screw because it "lifts" the adapter plate 206 away from the head stage 200) that is received in a respective threaded hole 244 formed in the adapter plate 206, and a hold-down screw (also referred to herein as a fastening screw and a retaining screw) 246 that is threaded into the lip portion 204 of the head stage 200.

The adjusting screws 242 desirably are adapted to receive the blade of a conventional screwdriver for adjusting the axial position of the screws 242 in the direction of double-headed arrow A (FIG. 7). In the illustrated configuration, for example, each adjusting screw 242 is formed with a respective slot 248 to receive the blade of a flat-head type screwdriver. As can be appreciated from FIG. 7, the adjusting screws 242 bear against an adjacent surface of the lip portion 204 of the head stage 200. Hence, rotating an adjusting screw 242 (either clockwise or counter-clockwise) to adjust the axial position of the screw changes the tilt orientation of the adapter plate 206 relative to the head stage 200 (thus, changing the tilt orientation of the probe card relative to the semiconductor wafer under test).

In the illustrated embodiment, each hold-down screw 246 extends generally co-axially through a respective adjusting screw 242 to secure the adapter plate 206 to the lip portion 204. Each adjusting screw 242 desirably is formed with an interior bore 250 dimensioned to receive the head 252 of an associated hold-down screw 246. Each adjusting screw 242 in the illustrated form has a generally flat base, or end wall, 256 that bears on an adjacent surface portion of the lip portion 204. Each hold-down screw 246 has a threaded stem, or shaft, 258 that extends through an opening 260 formed in the end wall 256 of the associated adjusting screw 242 and is tightened into a corresponding threaded opening 254 in the lip portion 204.

In alternative embodiments, the hold-down screws 246 can be laterally offset from their respective adjusting screws 242. For example, each hold-down screw 246 can be situated in a side-by-side relationship with an adjusting screw 242. However, this configuration is less desirable because the hold-down screws, when tightened into the lip portion 204, can create a bending moment in the adapter plate 206. In other embodiments, each adjustment mechanism comprises an adjusting screw without a hold-down screw, in which case the adapter plate 206 can be secured to the lip portion 204 using alternative mechanisms.

In any event, to use the adjustment mechanisms 240, the hold-down screws 246 are loosened enough to permit rotation of the adjusting screws 242. One or more of the adjusting screws 242 are then adjusted as required to maximize contact between the probe tips of the probe card and their corresponding contacts on the semiconductor wafer. When the adjusting screws 242 are set at their desired positions, the hold-down screws 246 are tightened into openings 254 to retain the adapter plate 206 on the lip portion 204 and prevent movement of the adjusting screws 242. Because each hold-down screw 246 extends in a generally co-axial relationship relative to a respective adjusting screw 242, the hold-down screws 246 avoid creating an undesirable bending moment in the adapter plate 206, as can happen if the retaining screws 246 were to be spaced or offset from their respective adjusting screws 242.

In particular embodiments, the adjusting screws 242 have a pitch of about 80 to 120 threads/inch, with 100 threads/inch being a specific example. However, in alternative embodiments, the pitch of adjusting screws 242 can be greater than 120 threads/inch or less than 80 threads/inch, depending on the degree of precision that is required for a particular application. Where adjusting screws 242 having at least 100 threads/inch are used, the probes can be planarized relative to the semiconductor wafer to at least within a tolerance of about +/−4 microns.

In an alternative embodiment, the adjusting mechanisms 240 are optional, and the adapter plate 206 is retained to the lip portion 204 by conventional screws, spring-loaded screws, clamps, or types of fasteners. In yet another embodiment, the adjusting mechanisms 240 are installed in the probe-card-support plate 210, rather than in the adapter plate 206. In this embodiment, each adjustment mechanism includes an adjusting screw 242 received in a threaded hole in plate 210, such that the adjustment of the adjusting screw adjusts the tilt orientation of plate 210 relative to adapter plate 206. Each adjusting mechanism can also have a hold-down screw 246 extending generally co-axially through each adjusting screw 242 and tightened into one of multiple threaded holes in the adapter plate 206.

Figure 8:
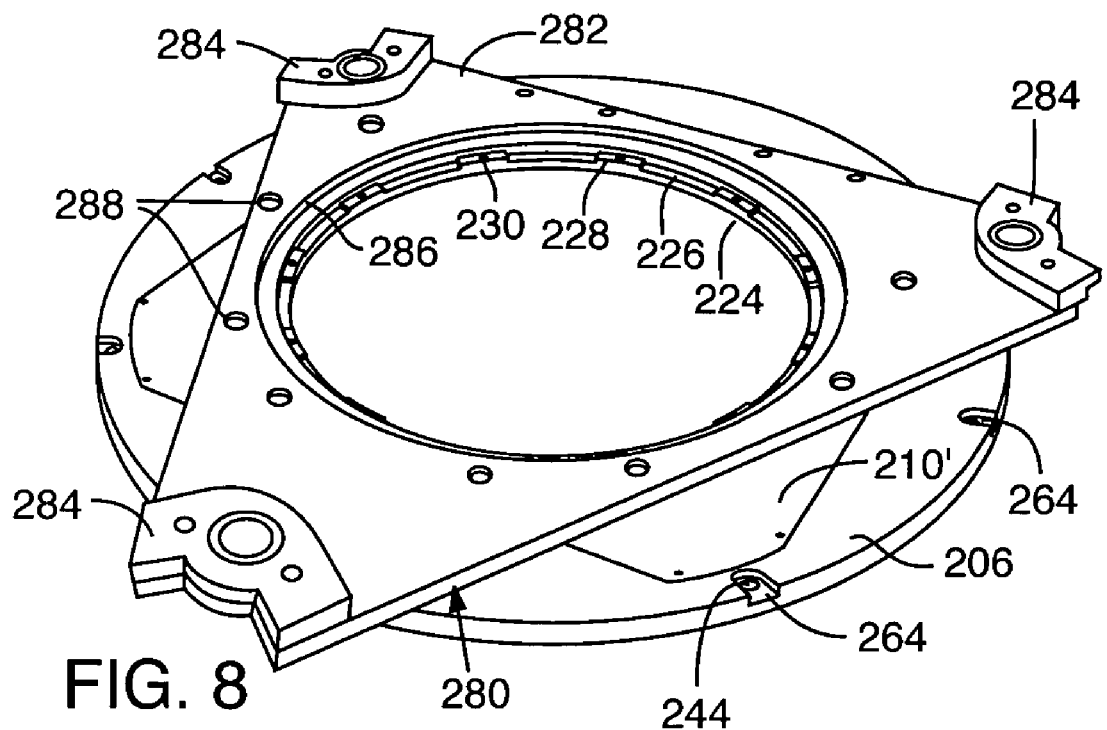
FIG. 8 is a perspective view of another embodiment of a probe-card-support plate and an adapter plate, as viewed from above, showing docking equipment mounted to the upper surface of the probe-card-support plate.

As noted above in connection with FIG. 4, docking equipment can be mounted to the probe-card-support plate 110'. In a similar manner, as shown in FIG. 8, docking equipment 280 can be mounted to a probe-card-support plate 210'. Docking equipment 280 in the illustrated configuration includes a docking-equipment plate 282 mounted to the probe-card-support plate 210'. Mounted to the docking-equipment plate 282 are docking units 284 for mating with respective docking units of a tester. As shown, the illustrated docking-equipment plate 282 defines an aperture 286 having a diameter that is equal to or larger than the diameter of the aperture 224 of the probe-card-support plate 210', thereby maintaining ease of access for attaching a probe-card assembly to the lip portion 226 of plate 210'. Docking-equipment plate 282 can further include one or more holes 288 dimensioned to receive corresponding fasteners (e.g., screws) for retaining plate 282 on plate 210'. Of course, the illustrated docking equipment 280 is one example of a docking configuration that can be used with the assembly shown in FIG. 8. Accordingly, various other types of docking equipment can be mounted to the probe-card-support plate 210' to enable use of the probe station with any available tester.

As further shown in FIG. 8, probe-card-support plate 210' can include notches, or recessed portions, 264 formed around holes 244. Notches 264 facilitate the insertion and removal of fasteners (e.g., conventional screws or adjustment mechanisms 240) into and from holes when installing or removing the probe-card-support plate 210'.

Figure 9:
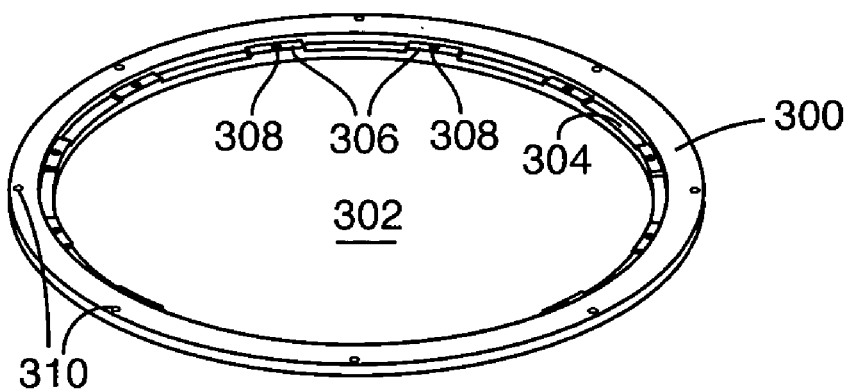
FIG. 9 shows a perspective view of another embodiment of a probe-card-support plate.

Referring now to FIG. 9, there is shown a generally annular probe-card-support plate 300 that is dimensioned to be supported by the lip portion 204 formed in the head plate 200 (FIG. 5). As noted above, the aperture 224 of probe-card-support plate 210 (FIG. 5) is dimensioned to receive the first probe-card assembly. Probe-card-support plate 300 (FIG. 9), in contrast, is formed with a larger aperture 302 dimensioned to receive the second, larger probe-card assembly. Since probe-card-support plates 210 and 300 and adapter plate 206 are removable from the head stage 200, the probe station can be easily converted between a first configuration in which the adapter plate 206 and probe-card-support plate 210 are installed on the probe station and second configuration in which the probe-card-support plate 300 is installed on the probe station, thus allowing the probe station to be used in testing two differently sized wafers (e.g., 200-mm wafers and 300-mm wafers).

As shown in FIG. 9, the probe-card-support plate 300 in the illustrated configuration can be formed with a respective lip portion, or rim, 304 surrounding aperture 302 for supporting the second probe-card assembly. Lip portion 304 can be formed with a plurality of circumferentially spaced bosses 306, each having a threaded hole 308 for retaining the second probe-card assembly. If desired, docking equipment (not shown) can be mounted to the top surface of plate 300, such as shown in FIGS. 4 and 8. Plate 300 can also be formed with one or more holes 310, which can be configured to receive one or more respective adjustment mechanisms 240 for adjusting the tilt orientation of the plate relative to the head stage 200. In other embodiments, conventional fasteners can be used to retain plate 300 to the head stage 200.

In an alternative embodiment, a probe-card-support plate can have the same general configuration of probe-card-support plate 300 and the same outer diameter of plate 300 so that it can be supported by lip portion 204 of the head stage 200 (FIG. 5). However, in this embodiment, the probe-card-support plate has a major aperture that has the same diameter of aperture 224 of plate 210 (FIG. 5) so that it can be used to support the first probe-card assembly. Thus, in this alternative embodiment, the probe-card-support plate can be supported directly on the lip portion 204 of the head stage 200 and the adapter plate 206 would not be needed.

In still other embodiments, additional probe-card-support plates and/or adapter plates configured to fit within aperture 202 of the head stage 200 can be provided to allow the probe station to be used to test more than two differently sized wafers.

FIG. 10 shows another embodiment of a probe-card-support plate, indicated at 400. This embodiment shares many similarities with the embodiment of FIG. 3. Hence, components in FIG. 10 that are identical to corresponding components in FIG. 3 have the same respective reference numerals and are not described further. The probe-card-support plate 400 can be used in the manner shown in FIG. 3 (i.e., supported directly on the head stage of a probe station) or in the manner shown in FIG. 5 (i.e., coupled to the head stage of a probe station by an adapter plate).

The probe-card-support plate 400 (FIGS. 10 and 10A) includes a plurality of adjustment mechanisms 240 for adjusting the tilt orientation of a probe-card assembly (not shown) supported by the probe-card-support plate 400. As best shown in FIG. 10A, each adjustment mechanism 240 includes an adjusting screw 242 received in a respective threaded opening 402 formed in the probe-card-support plate 400. Each adjusting screw 242 bears against an adjacent surface of a head stage 12 so that rotation of an adjusting screw adjusts the tilt orientation of the probe-card-support plate 400, and therefore the tilt orientation of a probe-card assembly supported therein. Each adjustment mechanism 240 can also include a retaining screw 246 extending into a threaded hole in the head stage 12. If an adapter plate (e.g., adapter plate 206 of FIG. 5) is used to couple the probe-card-support plate 400 to the head stage (e.g., as shown in FIGS. 5 and 6A), the adjusting screws would bear against the adapter plate and the retaining screws would extend into the adapter plate.

Equipping probe stations with the assemblies disclosed herein provide users of probe stations a standardized and more efficient way of testing semiconductor wafers of various sizes. Furthermore, the substantial costs associated with purchasing and maintaining multiple probe stations for testing differently sized wafers can be avoided.

The present invention has been shown in the described embodiments for illustrative purposes only. Further, the terms and expressions which have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims which follow.

I claim:

1. An assembly for testing semiconductor devices with a probe station, the probe station having a head stage, the assembly comprising:
   a first plate configured to be mounted to and completely removable from the head stage of the probe station;
   a second plate configured to be removably coupled to the first plate, the second plate having a major aperture for receiving a probe-card assembly and first and second, opposed major surfaces; and
   docking equipment mounted to the second plate to facilitate docking of a tester to the probe station, wherein the docking equipment comprises one or more docking units for mating with corresponding docking units on the tester.

2. The assembly of claim 1, further comprising at least one adjustment mechanism configured to adjust the tilt orientation of the probe-card assembly relative to the head stage.

3. The assembly of claim 2, wherein the at least one adjustment mechanism comprises an adjusting screw extending through the first plate and bearing against an adjacent surface of the head stage, wherein adjustment of the adjusting screw changes the tilt orientation of the first plate, the second plate, and the probe-card assembly relative to the head stage.

4. The assembly of claim 3, wherein the at least one adjustment mechanism further comprises a hold-down screw extending generally co-axially through the adjusting screw and being adapted to tighten into a corresponding hole in the head stage to retain the first plate on the head stage.

5. The assembly of claim 1, wherein the docking equipment comprises a support member mounted to the second plate and one or more docking units mounted to the support member.

6. The assembly of claim 1, wherein the second plate comprises a lip portion circumscribing the major aperture for supporting the probe-card assembly.

7. The assembly of claim 6, wherein the lip portion is formed with a plurality of circumferentially spaced bosses, each boss being formed with a threaded hole for receiving a fastener for retaining the probe-card assembly on the lip portion.

8. The assembly of claim 1, wherein:
   the head stage defines a head stage major aperture;
   the first plate is formed with a first plate major aperture and a recessed portion substantially surrounding the first plate major aperture; and
   the second plate is configured to fit within the recessed portion of the first plate such that whenever the second plate is positioned in the recessed portion, the major aperture of the second plate at least partially overlaps the first plate major aperture and the head stage major aperture, thereby allowing a probe card of the probe-card assembly to contact a semiconductor device in the probe station.

9. The assembly of claim 8, wherein whenever the second plate is positioned in the recessed portion of the first plate, an upper surface of the first plate is generally co-planar with an upper surface of the second plate.

10. The assembly of claim 1, further comprising at least one alignment pin extending from one of the first and second plates and a pin hole for receiving the alignment pin formed in the other of the first and second plates, the alignment pin and pin hole facilitating alignment of the second plate relative to the first plate.

11. The assembly of claim 1, wherein:
   the major aperture of the second plate is dimensioned to receive a probe-card assembly having a first diameter; and
   the assembly further comprises a third plate for mounting to the head stage when the first and second plate are not mounted to the head stage, the third plate being completely removable from the head stage and having a major aperture for receiving a probe-card assembly having a second diameter that is larger than the first diameter.

12. The assembly of claim 11, further comprising docking equipment mounted to the third plate.

13. The assembly of claim 12, wherein the docking equipment mounted to the third plate is different than the docking equipment mounted on the second plate.

14. A method for testing semiconductor wafers using a probe station having a head stage, the method comprising:
   mounting an adapter member to an upper surface of the head stage, the adapter member having an aperture and a recessed portion formed in the upper surface thereof and surrounding the aperture;
   positioning a probe-card assembly in an aperture defined in a docking-equipment-mounting member having docking equipment mounted thereon; and
   coupling the docking-equipment-mounting member to the adapter member by positioning the docking-equipment-mounting member in the recessed portion of the adapter member.

15. The method of claim 14, further comprising:
   positioning a semiconductor wafer in the probe station;
   docking a tester to the docking equipment; and
   testing the semiconductor wafer.

16. The method of claim 14, further comprising adjusting the tilt orientation of the probe-card assembly relative to the head stage to planarize the probe-card assembly relative to a wafer chuck of the probe station.

17. The method of claim 16, wherein adjusting the tilt orientation of the probe-card assembly comprises adjusting the tilt orientation of the adapter member relative to the head stage, thereby adjusting the tilt orientation of the docking-equipment-mounting member and the probe-card assembly.

18. The method of claim 16, wherein adjusting the tilt orientation of the probe-card assembly comprises adjusting the tilt orientation of the first docking-equipment-mounting member with respect to the adapter member and the head stage, thereby adjusting the tilt orientation of the probe-card assembly.

19. The method of claim 16, wherein adjusting the tilt orientation of the probe-card assembly comprises rotating an adjusting screw extending through the adapter member and contacting the head stage to cause the adapter member, and therefore the docking-equipment-mounting member and the probe-card assembly, to tilt relative to the head stage.

20. The method of claim 14, wherein coupling the docking-equipment-mounting member to the adapter member comprises aligning at least one alignment item on the docking-equipment-mounting member with at least one corresponding alignment item on the adapter member.

21. A method for testing semiconductor wafers using a probe station having a head stage, the method comprising:
   mounting an adapter member to an upper surface of the head stage;

positioning a probe-card assembly in an aperture defined in a docking-equipment-mounting member having docking equipment mounted thereon;
coupling the docking-equipment-mounting member to the adapter member;
positioning a semiconductor wafer in the probe station;
docking a tester to the docking equipment; and
testing the semiconductor wafer;
wherein the docking-equipment-mounting member is a first docking-equipment-mounting member, the probe-card assembly is a first probe-card assembly, the docking equipment comprises first docking equipment, and the method further comprises:
removing the first docking-equipment-mounting member from the adapter member;
coupling a second docking-equipment-mounting member to the adapter member, the second docking-equipment-mounting member having second docking equipment mounted thereon, the second docking equipment being different than the first docking equipment; and
positioning a second probe-card assembly in an aperture defined in the second docking-equipment-mounting member.

22. The method of claim 21, wherein the semiconductor wafer is a first semiconductor wafer, and wherein the tester is a first tester, and the method further comprises:
positioning a second semiconductor wafer in the probe station;
docking a second tester to the second docking equipment; and
testing the second semiconductor wafer.

23. A method for testing semiconductor wafers using a probe station having a head stage, the method comprising:
mounting an adapter member to an upper surface of the head stage;
positioning a probe-card assembly in an aperture defined in a docking-equipment-mounting member having docking equipment mounted thereon;
coupling the docking-equipment-mounting member to the adapter member;
positioning a semiconductor wafer in the probe station;
docking a tester to the docking equipment; and
testing the semiconductor wafer;
wherein the docking-equipment-mounting member is a first docking-equipment-mounting member, the probe-card assembly is a first probe-card assembly, the docking equipment comprises first docking equipment, and the method further comprises:
removing the adapter member and the first docking-equipment-mounting member from the head stage,
mounting a second docking-equipment-mounting member to the upper surface of the head stage, the second docking-equipment-mounting member having second docking equipment mounted thereon; and
positioning a second probe-card assembly in an aperture defined in the second docking-equipment-mounting member, the second probe-card assembly having a diameter that is different than the diameter of the first probe-card assembly.

24. The method of claim 23, wherein the semi-conductor wafer is a first semiconductor wafer and the tester is a first tester, and the method further comprises:
positioning a second semiconductor wafer in the probe station;
docking a second tester to the second docking equipment; and
testing the second semiconductor wafer.

25. The method of claim 24, wherein the second semiconductor wafer is larger than the first semiconductor wafer.

26. The method of claim 25, wherein the first semiconductor wafer has a nominal diameter of 200 mm and the second semiconductor has a nominal diameter of 300 mm.

27. A method for testing semiconductor wafers using a probe station having a head stage, the method comprising:
coupling a probe-card-support device to an upper surface of the head stage, the probe-card-support device comprising a first plate and a second plate nested within the first plate, the second plate defining an aperture and a rim circumscribing the aperture;
supporting a probe-card assembly on top of the rim of the second plate;
positioning a semiconductor wafer in the probe station; and
adjusting the tilt orientation of the probe-card-support device with respect to the head stage, thereby adjusting the tilt orientation of the probe-card assembly relative to the wafer to optimize contact between probes of the probe-card assembly and corresponding contacts of the wafer.

28. The method of claim 27, further comprising:
docking a tester to the probe station;
electrically connecting a probe card of the probe-card assembly to the wafer and the tester; and
testing the wafer.

29. The method of claim 27, further comprising:
mounting docking equipment to the probe-card-support device;
docking a tester to the docking equipment;
electrically connecting a probe card of the probe-card assembly to the wafer and the tester; and
testing the wafer.

30. The method of claim 27, further comprising:
removing the first plate and the second plate from the head stage;
coupling another probe-card-support device to the head stage; and
supporting another probe-card assembly on the latter probe-card-support device.

31. The method of claim 27, further comprising:
providing at least one adjusting screw extending through the first plate and bearing against the head stage; and
wherein adjusting the tilt orientation of the probe-card-support device comprises rotating the adjusting screw to cause the first plate, and therefore the second plate and the probe-card assembly, to tilt relative to the head stage.

32. The method of claim 31, further comprising retaining the first plate to the head stage by tightening a retaining screw into the head stage, the retaining screw extending through the adjusting screw.

33. An apparatus for testing semiconductor wafers with a probe station having a head stage, the apparatus comprising:
a probe-card-support device for supporting a probe-card assembly when testing a semiconductor wafer with the probe station, the probe-card-support device being configured to be mounted to and completely removable from the head stage, the probe-card-support device being adjustable for adjusting the tilt orientation of the probe-card assembly with respect to the head stage and the semiconductor wafer so as to planarize the probe-card assembly relative to the semiconductor wafer;
wherein the probe-card-support device comprises a first plate for supporting the probe-card assembly and a second plate for supporting the first plate, the second plate being configured to be mounted to and completely removable from the head stage, the second plate having a major aperture and a recessed portion surrounding the major aperture, the first plate being adapted to fit within the recessed portion and having an upper surface that is planar with the upper surface of the second plate when disposed in the recessed portion.

34. The apparatus of claim 33, wherein the first plate is formed with a major aperture and a lip portion extending around the major aperture, the lip portion being formed with a plurality of circumferentially spaced bosses, each boss being formed with a threaded hole for receiving a fastener for retaining the probe-card assembly on the lip portion.

35. The apparatus of claim 33, further comprising docking equipment mounted to the probe-card-support device, the docking equipment adapted to facilitate docking of a tester to the probe station.

36. The apparatus of claim 33, further comprising at least one adjustment mechanism for adjusting the tilt orientation of the probe-card assembly, the adjustment mechanism comprising an adjusting screw extending through the second plate and bearing against an adjacent surface of the head stage such that rotation of the adjusting screw changes the tilt orientation of the second plate, and therefore the first plate and the probe-card assembly, relative to the head stage.

37. The assembly of claim 36, further comprising a retaining screw, the retaining screw extending through the adjusting screw and being adapted to be tightened into the head stage for retaining the second plate on the head stage.

38. The assembly of claim 33, wherein the second plate is supported directly on the head stage.

39. A system for testing semiconductor devices, the system comprising:
a probe station comprising a head stage;
a tester for docking with the probe station during testing of a semiconductor device;
an adapter member configured to be mounted to and completely removable from the head stage;
a probe-card-support member configured to be mounted to and completely removable from the adapter member, the probe-card-support member having first and second opposed major surfaces and a major aperture for receiving a probe-card assembly; and
docking equipment mounted to one of the first and second major surfaces of the probe-card-support member, the docking equipment being adapted to mate with docking equipment on the tester.

40. The system of claim 39, wherein the docking equipment comprises at least one kinematic docking unit.

41. The system of claim 39, wherein:
the head stage defines a major aperture;
the adapter member defines a major aperture; and
wherein whenever the adapter member is mounted to the head stage and the probe-card-support member is mounted to the adapter member, the major aperture of the probe-card-support member at least partially overlaps with the major apertures of the head stage and adapter member to allow the probe-card assembly to be electrically connected to a semiconductor device in the probe station.

42. An assembly for use in testing semiconductor devices with a probe station having a head stage, the assembly comprising:
an adapter plate configured to be mounted to and completely removable from the head stage of the probe station, the adapter plate having a major aperture and a recessed portion surrounding the major aperture;
a first probe-card-support plate configured to nest within the recessed portion of the adapter plate, the probe-card-support plate having first and second opposed major surfaces and a major aperture dimensioned to receive a first probe-card assembly adapted to test a first semiconductor wafer;
a first set of docking equipment mounted to one of the first and second major surfaces of the first probe-card-support plate, the docking equipment being adapted to facilitate docking of a tester to the probe station;
a plurality of adjustment mechanisms for adjusting the tilt orientation of the first probe-card assembly, each adjustment mechanism comprising an adjusting screw and a hold-down screw, each adjusting screw extending through the adapter plate and bearing against an adjacent surface of the head stage, each hold-down screw extending generally co-axially through a respective adjusting screw into the head stage for retaining the adapter plate on the head stage, wherein when the hold-down screws are loosened to permit movement of the adapter plate relative to the head stage, adjustment of the adjusting screw changes the tilt orientation of the adapter plate, and therefore the probe-card-support plate and the probe-card assembly, relative to the head stage;
a second probe-card-support plate configured to be mountable to and completely removable from the head stage without the use of the adapter plate, the second probe-card-support plate having first and second opposed major surfaces and a major aperture dimensioned to receive a second probe-card assembly adapted to test a second semiconductor wafer, the second semiconductor wafer having a diameter that is greater than the diameter of the first semiconductor wafer; and
a second set of docking equipment mounted to one of the first and second major surfaces of the second probe-card-support plate, the docking equipment being adapted to facilitate docking of a tester to the probe station.

* * * * *